United States Patent
Lin et al.

(10) Patent No.: US 6,178,118 B1
(45) Date of Patent: Jan. 23, 2001

(54) ELECTRICALLY PROGRAMMABLE SEMICONDUCTOR DEVICE WITH MULTI-LEVEL WORDLINE VOLTAGES FOR PROGRAMMING MULTI-LEVEL THRESHOLD VOLTAGES

(75) Inventors: Chin-Hsi Lin; Ful-Long Ni, both of Hsinchu (TW)

(73) Assignee: Macronix International Co., Ltd. (TW)

(*) Notice: Under 35 U.S.C. 154(b), the term of this patent shall be extended for 0 days.

(21) Appl. No.: 09/270,810

(22) Filed: Mar. 17, 1999

Related U.S. Application Data (63) Continuation-in-part of application No. 09/251,849, filed on Feb. 17, 1999, and a continuation-in-part of application No. 09/229,460, filed on Jan. 12, 1999, now Pat. No. 6,046,934, which is a continuation-in-part of application No. 08/918,796, filed on Aug. 26, 1997, now Pat. No. 5,959,892.

(51) Int. Cl.[7] ................................................. G11C 16/04
(52) U.S. Cl. ............................... 365/185.28; 365/185.18; 365/185.19
(58) Field of Search .......................... 365/185.28, 185.18, 365/185.19, 185.23, 185.14

(56) References Cited

U.S. PATENT DOCUMENTS

| | | | |
|---|---|---|---|
| 5,042,009 | 8/1991 | Kazerounian et al. | 365/185 |
| 5,172,338 | 12/1992 | Mehrotra et al. | 365/201 |
| 5,218,569 | 6/1993 | Banks | 365/189.01 |
| 5,220,531 | 6/1993 | Blyth et al. | 365/189.07 |
| 5,293,560 | 3/1994 | Harari | 365/189.07 |
| 5,422,845 | 6/1995 | Ong | 365/63 |
| 5,463,586 | 10/1995 | Chao et al. | 365/210 |
| 5,566,111 | 10/1996 | Choi | 365/185.22 |
| 5,590,070 | 12/1996 | Harrand et al. | 365/149 |
| 5,590,076 | 12/1996 | Haddad et al. | 365/185.25 |
| 5,615,153 | 3/1997 | Yiu et al. | 365/185.19 |
| 5,712,815 | 1/1998 | Bill et al. | 365/185.03 |
| 5,729,489 | 3/1998 | Fazio et al. | 365/185.03 |
| 5,808,937 | 9/1998 | Chi et al. | 365/185.33 |

Primary Examiner—Son T. Dinh
(74) Attorney, Agent, or Firm—Beyer Weaver & Thomas, LLP (57) ABSTRACT

An electronically programmable semiconductor memory device that is able to provide stepped wordline voltages is disclosed. During programming of multi-level threshold voltages into memory cells within the electronically programmable semiconductor memory device, the stepped wordline voltages are used. The stepping through the wordline voltages is controlled by source-side voltage monitoring of the memory cells during programming. Threshold voltages of the memory cells are able to be programmed to three or more distinct voltage levels.

22 Claims, 6 Drawing Sheets

ELECTRICALLY PROGRAMMABLE SEMICONDUCTOR DEVICE WITH MULTI-LEVEL WORDLINE VOLTAGES FOR PROGRAMMING MULTI-LEVEL THRESHOLD VOLTAGES

CROSS-REFERENCE TO RELATED APPLICATIONS

This application is a continuation-in-part of: (i) U.S. patent application Ser. No. 09/251,849, filed Feb. 17, 1999, and entitled "ELECTRICALLY PROGRAMMABLE SEMICONDUCTOR DEVICE WITH CONCURRENT PROGRAM AND VERIFICATION OPERATIONS", which is hereby incorporated herein by reference for all purposes, and which is a continuation-in-part of U.S. patent application Ser. No. 08/918,796, filed Aug. 26, 1997, now U.S. Pat. No. 5,959,892 and entitled "APPARATUS AND METHOD FOR PROGRAMMING VIRTUAL GROUND EPROM ARRAY CELL WITHOUT DISTURBING ADJACENT CELLS", which is also hereby incorporated herein by reference for all purposes; and (ii) U.S. patent application Ser. No. 09/229,460, filed Jan. 12, 1999, now U.S. Pat. No. 6,046,934 and entitled "METHOD AND DEVICE FOR MULTI-LEVEL PROGRAMMING OF A MEMORY CELL", which is hereby incorporated herein by reference for all purposes.

BACKGROUND OF THE INVENTION

1. Field of the Invention

The present invention relates to semiconductor memory devices and, more particularly, to electrically programmable memory devices with improved programmability.

2. Description of the Related Art

Electronically programmable read only memory (EPROM), erasable electronically programmable read only memory (EEPROM) and Flash memory are classes of floating gate memory devices. More particularly, these floating gate memory devices are programmable memory devices which use floating gates as charge storage layers.

In recent years, techniques have been developed to increase the programming speed for floating gate memories. In particular, U.S. Pat. No. 5,615,153 describes an approach to increase programming speed by increasing wordline (gate voltages) while source voltage is held constant, and is hereby incorporated by reference. By starting at a lower wordline voltage, and increasing the wordline voltage to a higher wordline voltage during programming, programming speed is increased and a high final turn-on threshold voltage can be achieved.

While this approach is able to increase programming speed, there are still several disadvantages. One disadvantage is that threshold voltage distribution difficulties can result when fast programming is performed. Another disadvantage is that programming of floating gate memories has been done in small programming steps wherein after the completion of each programming step a verifying operation must be performed to determine the validity of the last programming step. The verifying operation has typically been done as a separate operation. For example, such repetitive programming techniques are further described in U.S. Pat. No. 5,172,338 and U.S. Pat. No. 5,220,531. As a result, these conventional repetitive programming techniques require a long time for programming to complete largely because of the inefficiency of having to switch between a programming mode of operation and a verify mode of operation after each programming step.

In the view of the foregoing, there is a need for faster and more efficient schemes for programming electrically programmable memory cells.

SUMMARY OF THE INVENTION

Broadly speaking, the invention pertains to an electronically programmable semiconductor memory device that is able to provide stepped wordline voltages during programming of multi-level threshold voltages into memory cells within the electronically programmable semiconductor memory device. The stepping through the wordline voltages is controlled by source-side voltage monitoring of the memory cells during programming.

The invention can be implemented in numerous ways, including as a device, an apparatus and a method. Several embodiments of the invention are discussed below.

As a semiconductor memory device, one embodiment of the invention includes: an array of floating gate memory cells, the array including wordlines, bitlines and ground lines, each of the floating gate memory cells can be programmed to three or more different threshold voltage levels; a program controller operatively connected to at least one of the bitlines of the array, the program controller to receive data to be stored in the array and to control the programming of the threshold voltage levels in the floating gate memory cells in accordance with the received data; and a wordline program voltage controller operatively connected to at least one of the wordlines of the array, the wordline program voltage controller provides a stepped wordline voltage to the at least one of the wordlines of the array dependent on upon the threshold voltage level to be programmed.

As a semiconductor memory device, another embodiment of the invention includes: an array of floating gate memory cells, the array including wordlines, bitlines and ground lines, each of the floating gate memory cells can be programmed to three or more different threshold voltage levels; a program controller operatively connected to at least one of the bitlines of the array, the program controller to receive data to be stored in the array and to control the programming of the threshold voltage levels in the floating gate memory cells in accordance with the received data; a program current controller that resistively couples at least one of the ground lines of the array to a predetermined low voltage potential during programming of the threshold voltages; and a wordline program voltage controller operatively connected to at least one of the wordlines of the array, the wordline program voltage controller provides a stepped wordline voltage to the at least one of the wordlines of the array dependent on a signal level on the at least one of the ground lines of the array.

As a method for programming a threshold voltage level in a memory cell of an electricially programmable semiconductor memory device to one of a plurality of predetermined threshold voltage levels, one embodiment of the invention includes the operations of: applying a high voltage to a drain terminal of the memory cell; applying a first gate voltage to a gate terminal of the memory cell during a first programming phase when a first threshold voltage level is being programmed; coupling a source terminal of the memory cell to a low voltage; monitoring the voltage on the source terminal of the memory cell during the programming to determine when the first threshold voltage level has been programmed; and subsequently applying a second gate voltage to the gate terminal of the memory cell during a second programming phase after the monitoring determines that the first threshold voltage level has been programmed and when a second threshold voltage level is being programmed, the second gate voltage being greater than the first gate voltage.

The invention has numerous advantages. Different implementations or embodiments of the invention may have one or more of the following advantages. One advantage is that memory cells are able to be programmed at high speed with good self-convergence and improved threshold voltage distribution can be obtained. Another advantage of the invention is that verification can be simultaneously performed with the programming of memory cells in the semiconductor memory device.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to an electronically programmable semiconductor memory device that is able to provide stepped wordline voltages during programming of multi-level threshold voltages into memory cells within the electronically programmable semiconductor memory device. The stepping through the wordline voltages is controlled by source-side voltage monitoring of the memory cells during programming. Threshold voltages of the memory cells are able to be programmed to three or more distinct voltage levels.

In the following detailed description of the invention, numerous specific details are set forth in order to provide a thorough understanding of the invention. However, it will become obvious to those skilled in the art that the invention may be practiced without these specific details. In other instances, well known methods, procedures, components, and circuitry have not been described in detail to avoid unnecessarily obscuring aspects of the invention.

Embodiments of the invention are discussed below with reference to FIGS. 1–8. However, those skilled in the art will readily appreciate that the detailed description given herein with respect to these figures is for explanatory purposes as the invention extends beyond these limited embodiments.

Figure 1:
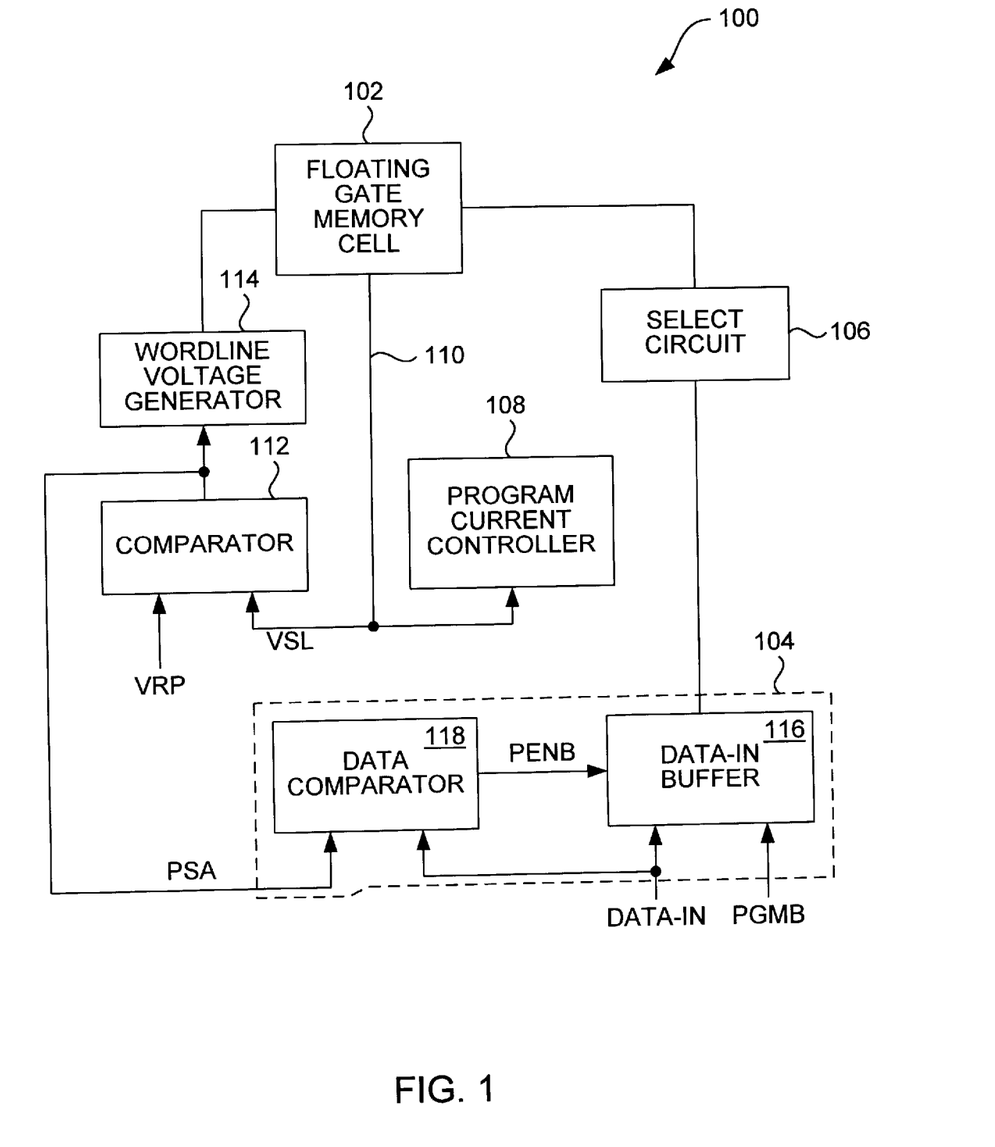
FIG. 1 is a block diagram of an electronically programmable semiconductor memory device according to one embodiment of the invention.

FIG. 1 is a block diagram of an electronically programmable semiconductor memory device 100 according to one embodiment of the invention. The semiconductor memory device 100 describes a memory cell and associated circuitry for programming the threshold voltage level in the memory cell. The memory cell is a floating gate memory cell and is normally found within an array of such memory cells. Hence, FIG. 1 is representative of a single floating gate memory cell and the associated circuitry for programming the memory cell. Hence, various selectors, decoders and address circuits that are well known and not shown or described herein.

The semiconductor memory device 100 includes a floating gate memory cell 102 that is representative of the memory cells found within the semiconductor memory device 100. The floating gate memory cell 102 has a threshold level that can be programmed to three or more different levels. In this manner, a single memory cell is able to effectively store more than one bit of information.

The semiconductor memory device 100 also includes a program controller 104 to control the programming of the floating gate memory cell 102. The program controller 104 receives a data-in signal (DATA-IN) and a program request bar signal (PGMB). The data-in signal (DATA-IN) represents data to be stored in the floating gate memory cell 102 and the program request bar signal (PGMB) provides an indication of when the semiconductor memory device 100 should begin a programming operation. The program controller 104 is coupled to the floating gate memory cell 102 through a select circuit 106. In one embodiment, the select circuit 106 couples to the floating gate memory cell 102 at a drain terminal.

In addition, the semiconductor memory device 100 includes a program current controller 108. The program current controller 108 is coupled to the floating gate memory cell 102 through a source line 110. In one embodiment, the source line 110 connects to a source terminal of the floating gate memory cell 102. During programming, the program current controller 108 operates to couple the source line 110 to ground in a controlled manner such that the programming of the threshold voltage level of the floating gate memory cell 102 is performed.

The semiconductor memory device 100 also includes a comparator 112 and a voltage generator 114. The comparator 112 is coupled to the source line 110. The comparator 112 monitors the voltage on the source line 110 (VSL) during the programming operation. More particularly, the comparator 112 compares the monitored source line voltage (VSL) to a reference voltage (VRP) and produces a program level signal (PSA) based on the comparison. The program level signal (PSA) produced by the comparator 112 is supplied to the voltage generator 114. The voltage generator 114 outputs a voltage to the floating gate memory cell 102. In one embodiment, the output voltage by the voltage generator 114 is supplied to a gate terminal of the floating gate memory cell 102. The program level signal (PSA) produced by the comparator 112 thus indicates that the particular threshold voltage level has been programmed into the floating gate memory cell 102. The program level signal (PSA) output from the comparator 112 is also supplied to the program controller 104 so that the programming operation can be stopped when the appropriate threshold voltage level has been programmed.

The program controller 104 includes a data-in buffer 116 and a data comparator 118. The data-in buffer 116 receives the data-in signal (DATA-IN) and the program request bar signal (PGMB) as well as a program enable bar (PENB) signal supplied by the data comparator 118. When the program enable bar (PENB) signal is low and the program request bar (PGMB) signal is low, then the data-in buffer 116 begins a program operation by supplying a high voltage to the floating gate memory cell 102 through the select circuit 106 based upon the data-in value to be programmed. The data comparator 118 supplies the program enable bar signal (PENB) to the data-in buffer 116. When the data comparator 118 determines that the threshold voltage level for the floating gate memory cell 102 has reached the desired level as indicated by the data-in signal (DATA-IN), then the data comparator 118 disables the programming operation by causing the programming enable bar signal (PENB) to be high.

The threshold voltage level can be programmed into a plurality of different levels. For example, in a four-state system, the threshold voltage level can be one of four different levels. The first level is a default and requires no programming. The three subsequent levels are successively programmed into one of the three programmed states. For example, when programming a threshold voltage level to the third level, the programming will initially begin with a first output voltage level being supplied by the voltage generator 114 to the floating gate memory cell 102. When the comparator 112 determines that the first threshold voltage level has been programmed (i.e., VSL<VRP), then a program level signal (PSA) is issued to the voltage generator 114 and the data comparator 118. When the data comparator 118 determines that the second threshold voltage level (first programmed state) is not the desired level to be programmed into the floating gate memory cell 102 according to the data-in signal (DATA-IN), the programming operation continues by supplying a second output voltage level from the voltage generator 114 to the floating gate memory cell 102. In other words, the voltage level supplied to the gate terminal of the floating gate memory cell 102 is stepped-up to the next level. The second output voltage level supplied by the voltage generator 114 is greater than the first output voltage level previously supplied by the voltage generator 114. Thereafter, the when the comparator 112 determines that the third threshold voltage level has been programmed, the data comparator 1 18 at that point would cause the programming operation to cease because the desired threshold voltage level has been programmed.

By successively increasing the output voltage level (e.g., stepped voltage levels) supplied to the floating gate memory cell 102 by the voltage generator 114 and using source-side detection of programmed state, increased programming speed, good self-convergence, and improved threshold voltage distribution are obtained.

Figure 2:
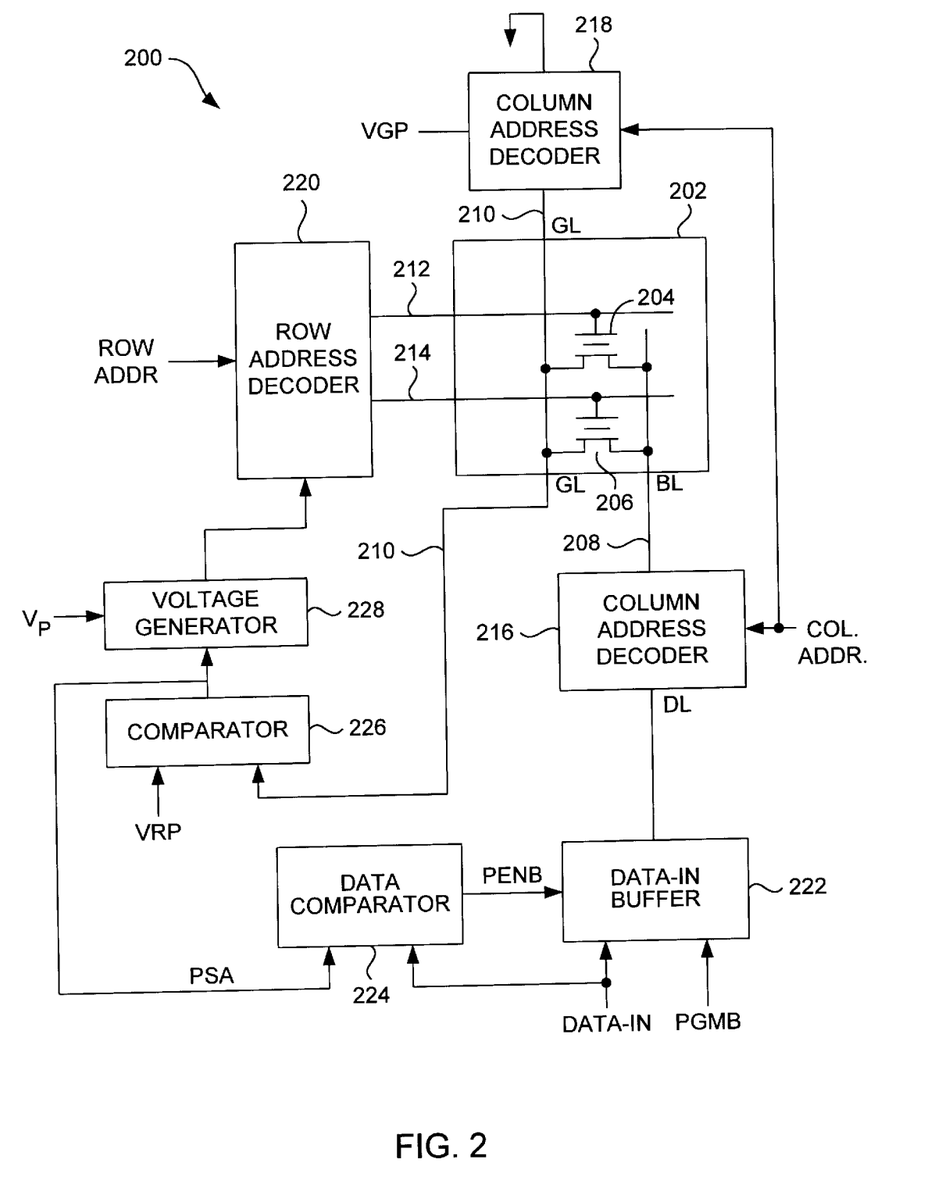
FIG. 2 is a block diagram of an electronically programmable semiconductor memory device according to another embodiment of the invention.

FIG. 2 is a block diagram of an electronically programmable semiconductor memory device 200 according to another embodiment of the invention. The semiconductor memory device 200 includes a memory array 202 including floating gate memory cells 204 and 206. The floating gate memory cells 204 and 206 are representative of a plurality of memory cells provided within the array 202. The array 202 includes a plurality of bit lines, a plurality of ground lines, and a plurality of wordlines. A bit line (BL) 208 is illustrated as being supplied to the drain terminals of the floating gate memory cells 204 and 206. A ground line (GL) 210 is shown as being supplied to the source terminals of the floating gate memory cells 204 and 206. Further, wordlines 212 and 214 are shown as being respectively supplied to the floating gate memory cells 204 and 206.

The floating gate memory cells 204 and 206 each have a drain terminal, a gate terminal, a source terminal and a floating gate. The floating gate memory cells 204 and 206 are preferably floating gate type Metal-Oxide-Semiconductor (MOS) Field Effect Transistor (FET). The memory cells 204 and 206 illustrated in FIG. 2 are N-type MOS (NMOS) transistors. These memory cells 204 and 206 supports more than two (2) different threshold voltage levels that are able to be programmed into the memory cells. In particular, in one implementation of the invention, the memory cells supports four (4) different threshold voltage levels. By using the four (4) different threshold levels, the memory cells can effectively store two (2) bits of information.

The semiconductor memory device 200 also includes a column address decoder 216 and a column address decoder 218. The column address decoder 216 selects one or more appropriate bit lines to activate during programming the floating gate memory cells within the array 202. In this embodiment, the selected bit line (BL) 208 is selected by a column address. The column address decoder 218 selects one or more appropriate ground lines to activate during programming the floating gate memory cells within the array 202. In this embodiment, the selected ground line (GL) 210 also selected by the column address. The column address decoder 218 also includes circuitry that couples the ground line (GL) 210 to a ground potential during programming under the control of a current control signal (VGP). Such circuitry is, for example, associated with the program current controller 108 illustrated in FIG. 1.

In addition, the semiconductor memory device 200 includes a row address decoder 220. In accordance with a row address signal, the row address decoder 220 selects one of the wordlines 212 and 214 to activate during the programming operation so as to program the selected one of the floating gate memory cells 204 and 206.

The invention uses a ground pull-down scheme to perform hot electron programming of the threshold voltage of a memory cell to multiple levels. In general, during programming, the drain terminal and the gate terminal are held to a high voltage level, and the voltage appearing at the source terminal for the memory cell is monitored. The change in voltage at the source terminal corresponds to a change in the source side voltage of the memory cell which is in turn related to a change in the threshold voltage of the memory cell. Hence, by monitoring the source side voltage appearing at the source terminal, the electronically programmable semiconductor memory device 200 can determine when the appropriate threshold voltage level has been programmed into the memory cell.

A programming operation begins by supplying a program request bar signal (PGMB) and a data-in signal (DATA-IN) to a data-in buffer 222. Upon receiving these inputs, as well as a program enable bar signal (PENB), the data-in buffer 222 supplies a high voltage signal on an output line (DL). The output line (DL) is then coupled to the bit line (BL) 208 by the column address decoder 216. A data comparator 224 supplies the program enable bar signal (PENB) to the data-in buffer 222. The data comparator 224 receives the data-in signal (DATA-IN) and a program level signal (PSA) and determines whether the programming operation needs to be performed or, if already being performed, can be stopped.

Once the data comparator 224 determines that the programming operation is not required or can be stopped, the program enable bar signal (PENB) goes to a high level. When the data-in buffer 222 receives the program enable bar signal (PENB) at a high level, the data-in buffer 222 removes the high voltage from the output line (DL), thus stopping the programming operation of the selected one of the floating gate memory cells within the array 202.

The program level signal (PSA) is supplied by a comparator 226 based on a comparison of the voltage level appearing on the ground line (GL) 210 in comparison to a reference voltage level (VRP). The voltage level on the ground line (GL) 210 corresponds to the threshold voltage level being programmed into the selected one of the floating gate memory cells within the array 202. When the voltage level on the ground line (GL) 210 becomes less than or equal to the reference voltage level (VRP), the comparator 226 determines that a particular threshold voltage level has been programmed into the selected floating gate memory cell and issues the program level signal (PSA) to not only signal the data comparator 224 of the programming state but also a voltage generator 228. When the voltage generator 228 is so signaled by the program level signal (PSA), the voltage generator 228 steps-up its output voltage to the next highest level. In one embodiment, the program level signal (PSA) is a next-step signal. The voltage generator 228 receives a high voltage power supply (Vp) and provides a plurality of lower stepped levels of output voltage depending on the program signal level (PSA). For example, the voltage generator 228 can output voltage steps of 8 volts, 10 volts and 12 volts as successive steps. The output voltage from the voltage generator 228 is supplied to the row address decoder 220 which couples the output voltage to the appropriate one of the word lines 212 and 214 corresponding the selected floating gate memory cell being programmed.

Other representative voltage levels at various locations in the electronically programmable semiconductor memory device 200 are identified in the following table.

| Programmed State | $V_{GL}$ | $V_{DL}$ | Vth | VRF |
|---|---|---|---|---|
| Vth0 | N/A | N/A | 1.5–2.0 v | N/A |
| Vth1 | ~2.3 v | ~6.75 v | 3.0–3.4 v | 2.3 v |
| Vth2 | ~2.3 v | ~6.75 v | 4.0–4.4 v | 2.3 v |
| Vth3 | ~2.3 v | ~6.75 v | 6.0–6.4 v | 2.3 v |

The output on the output line ($V_{DL}$) from the data-in duffer 222 is, for example, in a range from 6–7 Volts, and typically about 6.75 Volts. The threshold voltage level (Vth) being programmed is one of four (4) programmed states, including Vth0, Vth1, Vth2 and Vth3. The reference voltage (VRF) is, for example, about 2.3 Volts regardless of the threshold voltage level being programmed.

Figure 3:
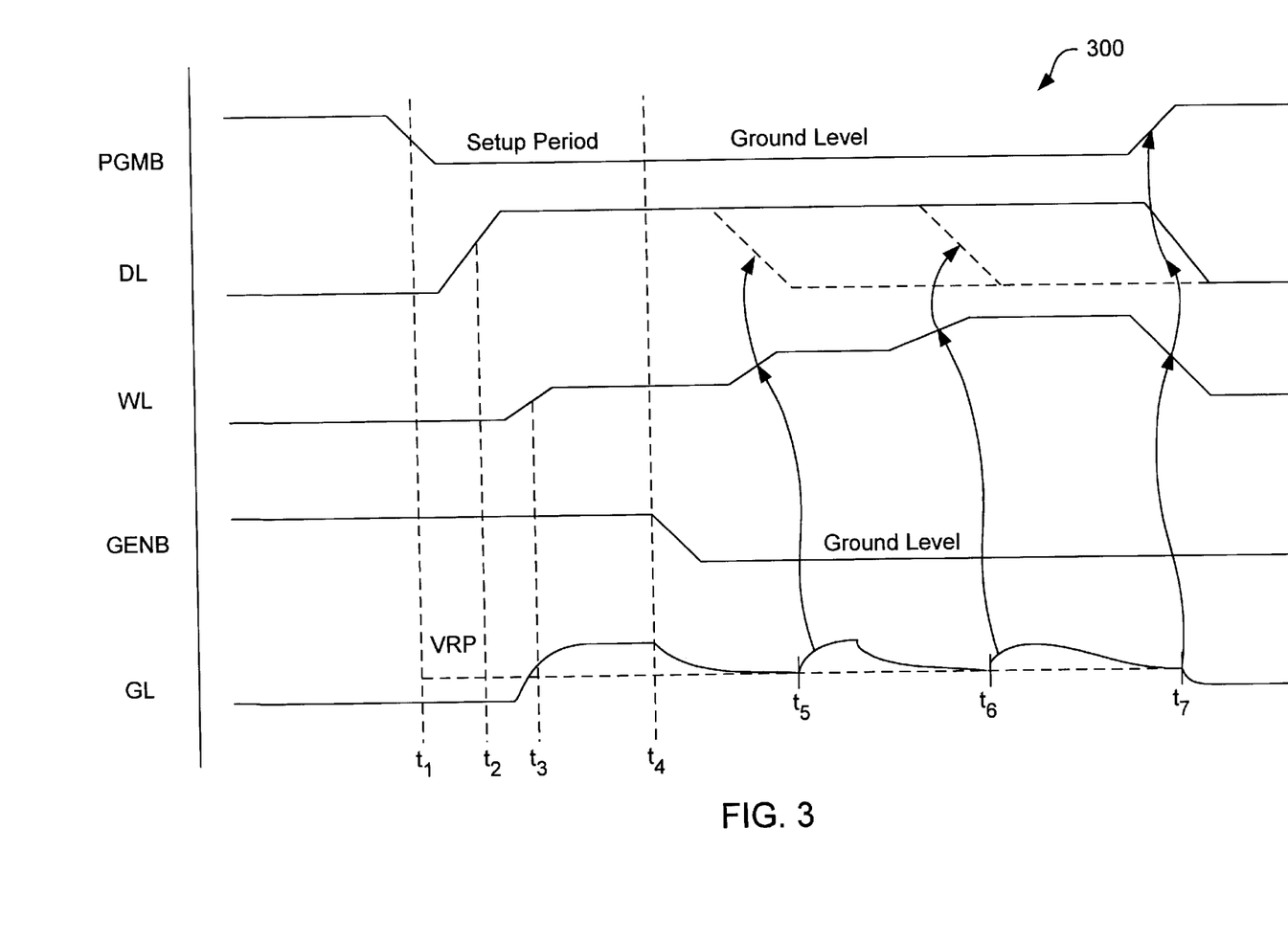
FIG. 3 is a timing diagram illustrating the timing of various signals involved in programming of threshold voltage levels for floating gate memory cells.

FIG. 3 is a timing diagram 300 illustrating the timing of various signals involved in the programming of threshold voltage levels for floating gate memory cells within the array 202 illustrated in FIG. 2 according to one embodiment of the invention. The programming operation begins at time t1 when the program request bar signal (PGMB) goes to a low level. Then, at time t2, the voltage on the output line (DL) from the data-in buffer 222 goes to a high voltage level and is supplied to the drain terminal of the selected floating gate memory cell through the column address decoder 216 and the bit line (BL) 208. Next, to begin the precharge stage (or setup period), the wordline (WL) for the selected floating gate memory cell is increased from a low voltage level (e.g., ground) to a first voltage level at time t3. As shown in FIG. 3, beginning at time t3 until time t4, the source line (SL) (or ground line (GL)) is raised to a high voltage level during the precharge stage. At time t4, the precharge stage is over and the programming stage is activated by a gate discharge enable bar signal (GENB) going to a low voltage level (e.g., ground). Once the gate discharge enable bar (GENB) signal goes to a low level, the programming of the threshold voltage level begins by coupling the source line (SL) (or ground line (GL)) to ground in a controlled manner. With respect to FIG. 2, the column address decoder 218 couples the ground line (GL) (or source line (SL)) to a low voltage potential (e.g., 2.3 Volts) in accordance with the current control signal (VGP) that is produced when the gate discharge enable bar signal (GENB) goes to the low voltage potential. Between time t3 and time t4, the voltage on the source line (SL) (ground line (GL)) is decreasing as the threshold voltage level is being programmed. The programming of the first threshold voltage level is completed when the voltage on the source line (SL) reaches the reference voltage level (VRP) at time t5. Then, at time t5, assuming additional programming is necessary, the second word line voltage level is applied to the appropriate word line (WL) and the programming of the second threshold voltage level begins. The programming of the second threshold voltage level is completed when the voltage on the source line (SL) reaches the reference voltage level (VRP) at time t6. Then, at time t6, assuming additional programming is necessary, the third word line voltage level is applied to the appropriate word line (WL) and the programming of the third threshold voltage level begins. At time t7, the programming of the third threshold voltage level is completed. Also, at time t7, there are no more additional greater level threshold voltage levels that can be programmed, so the program request bar signal (PGMB) is set to a high voltage level, thus causing the voltage on the output line (DL) from the data-in buffer 222 to return to a low level which prevents any further programming. The word line voltage level is also reset to a low voltage level at time t7.

Figure 4:
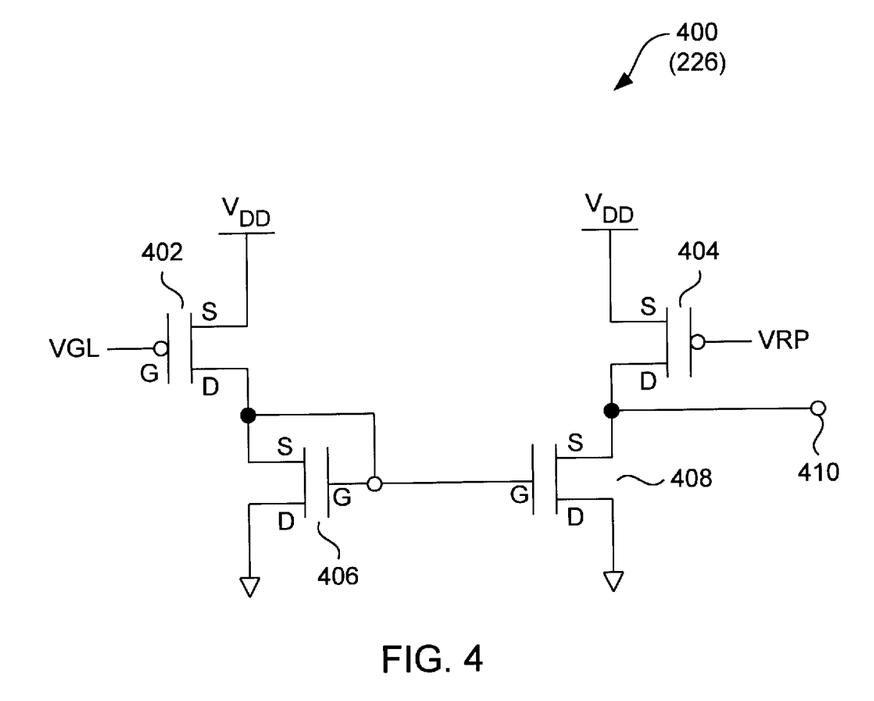
FIG. 4 is a schematic diagram of a comparator according to one embodiment of the invention.

FIG. 4 is a schematic diagram of a comparator 400 according to one embodiment of the invention. The comparator 400 is, for example, a suitable implementation of the comparator 226 illustrated in FIG. 2.

The comparator 400 includes PMOS gates 402 and 404 and NMOS gates 406 and 408. An output terminal 410 provides an indication of whether a ground line voltage (VGL) is less the reference voltage level (VRP). The ground line voltage (VGL) corresponds to the voltage on the ground line 210 of FIG. 2. The ground line voltage (VGL) is supplied to a gate terminal of the PMOS gate 402, and the reference voltage signal (VRP) is supplied to a gate terminal of the PMOS gate 404. The source terminals of the PMOS gates 402 and 404 are coupled to a power source ($V_{DD}$). A drain terminal of the PMOS gate 402 is coupled to a source terminal and a gate terminal of the NMOS gate 406. The gate terminal of the NMOS gate 406 is also connected to a gate terminal of the NMOS gate 408. Drain terminals for the NMOS gates 406 and 408 are coupled to ground. A drain terminal of the PMOS gate 404 is connected to the output terminal 410 and a source terminal of the NMOS gate 408.

Figure 5:
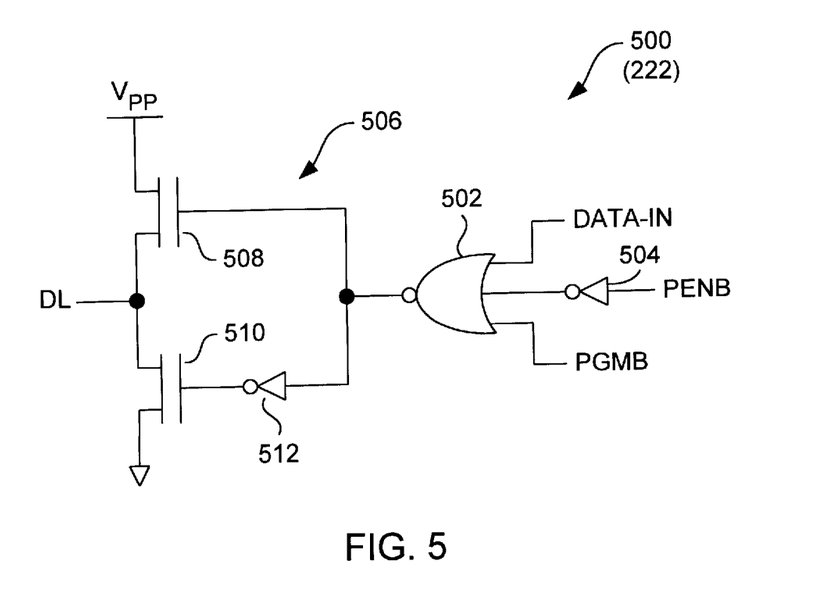
FIG. 5 is a schematic diagram of a data-in buffer according to one embodiment of the invention.

FIG. 5 is a schematic diagram of a data-in buffer 500 according to one embodiment of the invention. The data-in buffer 500 is, for example, suitable for use as the data-in buffer 222 illustrated in FIG. 2. The data-in buffer 500 includes a NOR circuit 502, an inverter 504, and an output circuit 506. The NOR circuit 502 receives one input from the data-in signal (DATA-IN), another input from the program request signal bar signal (PGMB), and still another input from the program enable signal bar (PENB) through the inverter 504. The output of the NOR circuit 502 is supplied to the output circuit 506. The output circuit 506 is a push-pull output circuit that produces the output voltage on the output line (DL). The output circuit 506 includes a first NMOS transistor 508, a second NMOS transistor 510, and an inverter 512 interconnected as shown in FIG. 5. Based on the voltage of the output of the NOR circuit 502, the output circuit 506 either produces a high voltage signal on the output line (DL) or a low voltage level (e.g., ground) on the output line (DL).

Although the invention pertains to programming threshold voltage levels, data stored in the semiconductor memory device (as the programmed threshold voltage levels) can also be read. Typically, a sense amplifier is coupled to the bit line (BL) and the ground line (GL) for the array of memory cells. With respect to FIG. 2, a sense amplifier would couple to the output line (DL) and the ground line 210. In one embodiment, the sense amplifier could incorporate the data comparator 224.

Figure 6:
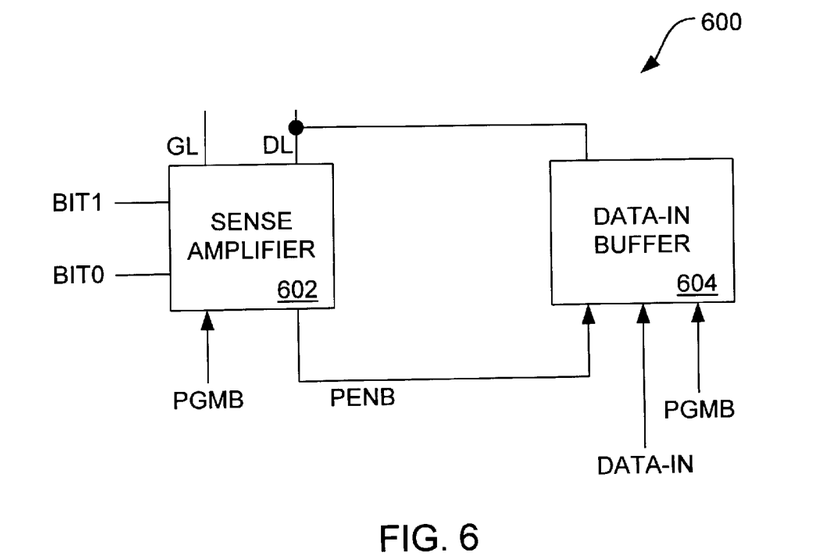
FIG. 6 is a block diagram of a sense amplifier and program controller according to one embodiment of the invention.

FIG. 6 is a block diagram of a modification 300 for the semiconductor memory device 200 illustrated in FIG. 2. The modification 300 replaces the data comparator 224 and the data-in buffer 222 illustrated in FIG. 2 with a sense amplifier 602 and a data-in buffer 604, respectively. The program request signal bar (PGMB) is supplied to the sense amplifier 602 and the data-in buffer 604 to initiate the programming operation. In general, a semiconductor memory device includes a sense amplifier to sense the data value stored in a particular memory cell. Here, the sense amplifier 602 performs such conventional functions as well as additionally participates in the programming of the threshold voltage levels for the memory cell. A data-in value (DATA-IN) is supplied to the data-in buffer 604 to indicate the data value to be stored in the particular memory cell. In other words, the data-in value (DATA-IN) determines the particular threshold voltage level to be programmed in the memory cell. For example, if the memory cells can be programmed to one of four levels, then the data value to be stored in the memory cell can also be one of four values.

During the programming operation, the sense amplifier 602 operates to sense when the voltage at the ground line (GL) (e.g., ground line 210) has dropped to a level that is associated with the desired threshold voltage. When the sense amplifier 602 determines during programming that the voltage level at the ground line (GL) has not yet declined to the value corresponding to the desired threshold voltage, the program enable signal bar (PENB) remains active (low) to signal the data-in buffer 604 to continue with the programming of the threshold voltage level. In such case, the data-in buffer 604 maintains its output line (DL) at a high voltage level (e.g., 6–7 Volts). Once the sense amplifier 602 determines that the voltage level appearing at the ground line (GL) has declined such that it is associated with the desired threshold voltage level for the memory cell, the sense amplifier 602 causes the program enable signal bar (PENB) to deactivate (i.e., go to a high level) and thus signals the data-in buffer 604 to cease programming of the memory cell. In such case, the data-in buffer 604 causes the output voltage line (DL) to go to a low voltage level. As a result, the bit line 208 is pulled low to cease the programming of the memory cell.

Figure 7:
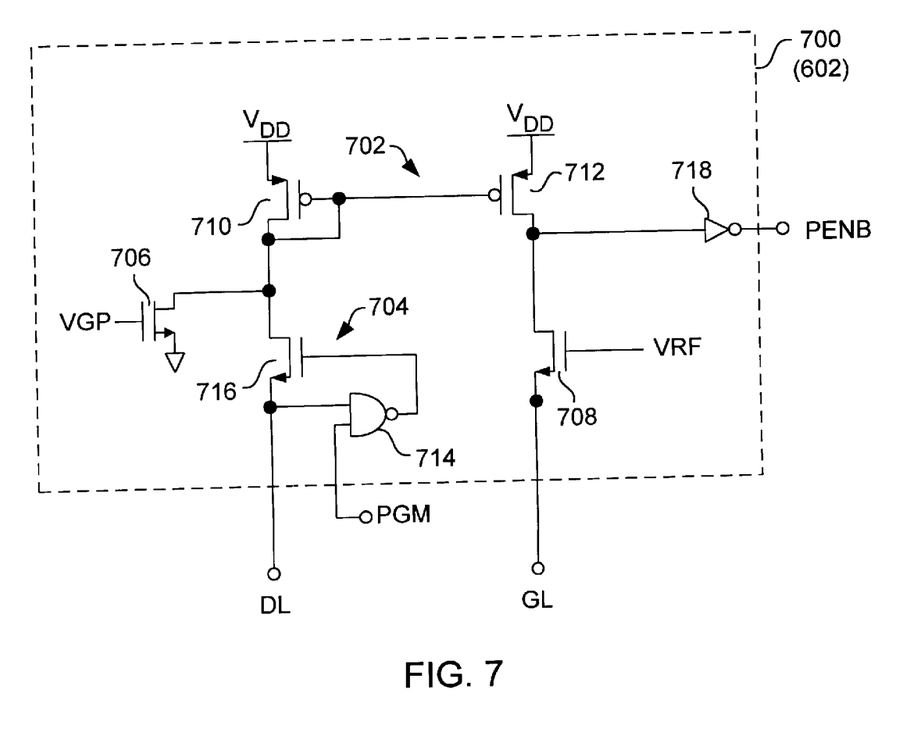
FIG. 7 is a schematic diagram of a sense amplifier according to one embodiment of the invention.

FIG. 7 is a schematic diagram of a sense amplifier 700 according to one embodiment of the invention. The sense amplifier 700 is, for example, suitable for use as the sense amplifier 602 illustrated in FIG. 6. The sense amplifier 700 includes a mirror circuit 702, a control circuit 704, a program Field Effect Transistor (FET) 706, and a reference FET 708. The mirror circuit 702 includes PMOS FETs 710 and 712 having source terminals connected to a positive voltage source (VDD) and having their gate terminals commonly connected. The control circuit 704 includes a NAND gate 714 and a NMOS FET 716. The NAND gate 714 receives the program request signal (PGM) and the output voltage on the output line (DL) as inputs, and produces a gate control signal for the NMOS FET 716. The drain terminal of the NMOS FET 716 is connected to the drain terminal of the PMOS FET 710, and the source terminal of the NMOS FET 716 is connected to the terminal NM (and the output line (DL)). The program FET 706 has a gate terminal that receives the program voltage signal (VGP), a drain terminal that connects to the drains of the FETs 710 and 716, and a source terminal connect to ground. The reference FET 708 has a gate terminal that receives the reference voltage signal (VRF), a drain terminal connected to the drain terminal of the PMOS FET 712, and a source terminal connected to the terminal NR. The sense amplifier 700 produces the program enable signal bar (PENB) via the inverter 718 which inverts the signal at the drain terminal of the FET 712. Although not shown in FIG. 7, the sense amplifier 602 also provides for reading data from the memory cell to yield the bit0 and bit1 outputs. Additional details pertaining to the reference FET 708 in described further in U.S. application Ser. No. 09/251,849, filed Feb. 17, 1999, and entitled "ELECTRICALLY PROGRAMMABLE SEMICONDUCTOR DEVICE WITH CONCURRENT PROGRAM AND VERIFICATION OPERATIONS", which has been incorporated by reference. The program FET 706 is used as a current source level to determine whether programming has been achieved or not. By driving the program FET 706 in accordance with the program voltage signal (VGP), better tracking with the programming current is achieved. The program FET 706 represents one embodiment of the program current controller 108 or the circuitry within the column address decoder 218.

Figure 8:
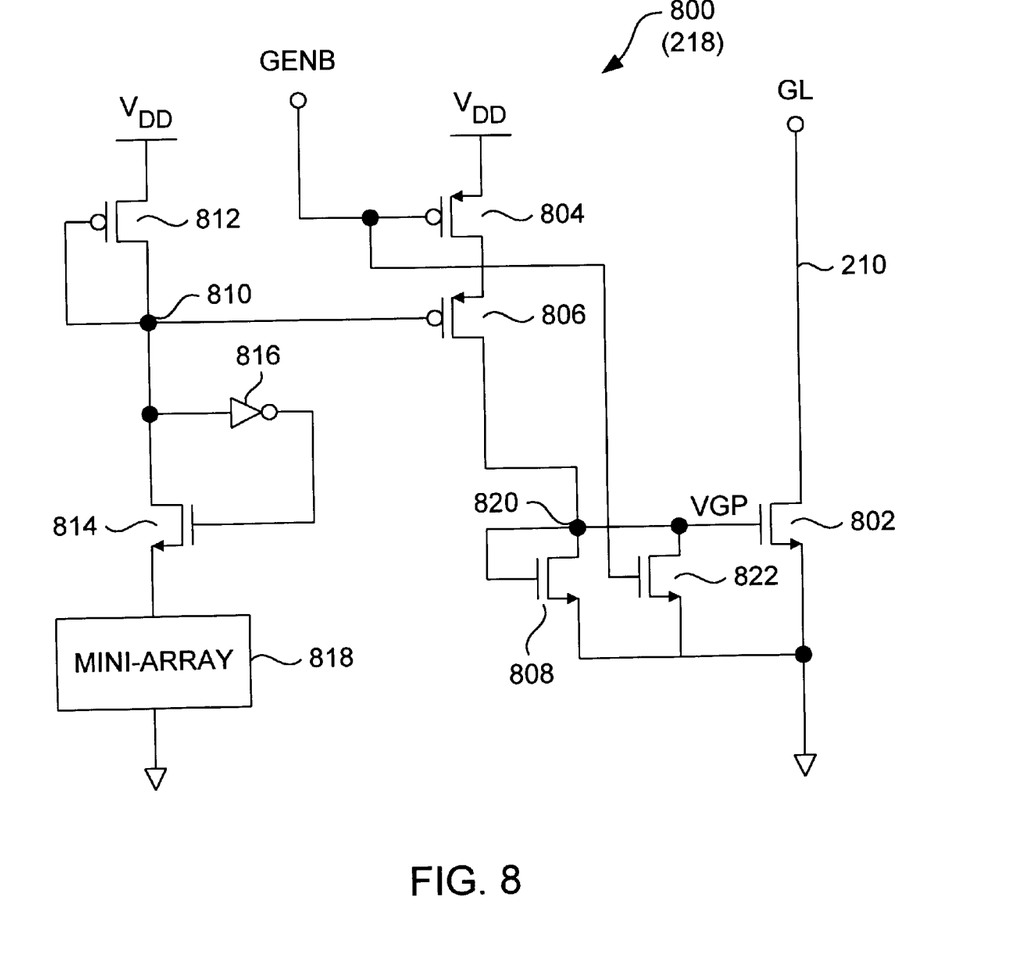
FIG. 8 is a schematic diagram of a program current controller according to one embodiment of the invention.

FIG. 8 is a schematic diagram of a program current controller 800 according to one embodiment of the invention. The program current controller 800 is, for example, associated with circuitry within the column address decoder 218 that is used in the programming operation to couple the ground line of interest to ground in a controlled manner. The program current controller 800 is also suitable for use as the program current controller 108 illustrated in FIG. 1 as well as for supplying the program voltage signal (VGP) to the program FET 706 illustrated in FIG. 7.

The program current controller 800 couples to a ground line (GL), namely, the ground line (GL) 210 illustrated in FIG. 2. A FET transistor 802 (i.e., MOS FET) couples the ground line (GL) 210 to ground when activated by a current control signal (VGP). In this embodiment, the current control signal (VGP) is provided in a controlled manner that is associated with the fabrication of the semiconductor memory device. The current control signal (VGP) activates the FET transistor 802 when a gate discharge enable bar signal (GENB) is low. The program current controller 800 also includes FET gates 804, 806 and 808 coupled in series between a supply voltage ($V_{DD}$) and ground. A gate terminal of the FET transistor 804 receives the gate discharge enable bar signal (GENB). A terminal 810 is coupled to a gate terminal of the FET transistor 806. The terminal 810 provides a processing sensitive voltage level to the FET 806.

The processing dependent voltage level at terminal 810 is provided by circuitry including FET gates 812 and 814, inverter 816 and a mini-array 818. The mini-array 818 is coupled between the FET transistor 814 and ground to provide a processing dependent characteristic that is used in obtaining the current control signal (VGP). The use of the mini-array 818 thus provides a process dependent characteristic that tracks the process dependent characteristic of the memory cell so that process independent characteristics for programming are obtained. In other words, the mini-array 818 compensates for process variations during programming. The memory cells within the mini-array 818 resemble those simultaneously fabricated within the regular array 202. The terminal 810 is normally at a controlled low voltage level that activates the FET transistor 806. Hence, when the gate discharge enable bar signal (GENB) is also low, a terminal 820 between the FET transistors 806 and 808 is pulled to a controlled high voltage level as determined by the FET transistors 804, 806 and 808 and the controlled low voltage level at the terminal 810. The terminal 820 provides the controlled voltage level to the gate of the FET transistor 802 as the current control signal (VGP). When the gate discharge enable bar signal (GENB) is at a high voltage level, the terminal 820 is not pulled high and a FET transistor 822 couples the gate terminal of the FET transistor 802 to ground so as to deactivate the FET transistor 802 and thus prevent programming.

Additionally, if the slew rate at the source side voltage of the memory cell being programmed is fast, the distribution of the threshold voltage (Vth) will not be uniform. To improve distribution, the voltage programming signal (VPG) can be pulsed in any of the above embodiments. By pulsing the voltage programming signal (VPG), the rate of programming can be slowed and thus distribution improved.

The invention has numerous advantages. Different implementations or embodiments of the invention may have one or more of the following advantages. One advantage is that memory cells are able to be programmed at high speed with good self-convergence and improved threshold voltage distribution can be obtained. Another advantage of the invention is that verification can be simultaneously performed with the programming of memory cells in the semiconductor memory device.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A semiconductor memory device, comprising:
    an array of floating gate memory cells, said array including wordlines, bitlines and ground lines, each of the floating gate memory cells can be programmed to three or more different threshold voltage levels;
    a program controller operatively connected to at least one of the bitlines of said array, said program controller to receive data to be stored in said array and to control the programming of the threshold voltage levels in the floating gate memory cells in accordance with the received data; and
    a wordline program voltage controller operatively connected to at least one of the wordlines of said array, said wordline program voltage controller provides a stepped wordline voltage to the at least one of the wordlines of said array dependent on upon the threshold voltage level to be programmed.

2. A semiconductor memory device as recited in claim 1, wherein said wordline program voltage controller causes the stepped wordline voltage to step to the next successive step at occurrence of the threshold voltage levels.

3. A semiconductor memory device as recited in claim 1, wherein the stepped wordline voltage is increased in successive steps during programming of the threshold voltages.

4. A semiconductor memory device as recited in claim 3, wherein the number of successive steps in which the stepped wordline voltage increases is dependent upon the threshold voltage level to be programmed.

5. A semiconductor memory device as recited in claim 1, wherein said wordline program voltage controller comprises:
    a comparator operatively connected to at least one of the ground lines of said array, said comparator compares the signal level on the at least one of the ground lines of said array with a reference signal to produce a next-step signal; and
    a voltage generator operatively connected to said comparator, said voltage generator produces the stepped wordline voltage for the at least one of the wordlines of said array in accordance with the next-step signal from said comparator.

6. A semiconductor memory device as recited in claim 5, wherein the stepped wordline voltage is increased in successive steps during programming of the threshold voltages, and
    wherein during programming of the threshold voltages, said voltage generator outputs the next successive step of the stepped wordline voltage upon receiving the next-step signal from said comparator.

7. A semiconductor memory device as recited in claim 6, wherein the next-step signal indicates that the particular one of the threshold voltage levels have been programmed and that additional programming is needed to reach subsequent threshold voltage levels.

8. A semiconductor memory device, comprising:
    an array of floating gate memory cells, said array including wordlines, bitlines and ground lines, each of the floating gate memory cells can be programmed to three or more different threshold voltage levels;
    a program controller operatively connected to at least one of the bitlines of said array, said program controller to receive data to be stored in said array and to control the programming of the threshold voltage levels in the floating gate memory cells in accordance with the received data;
    a program current controller that resistively couples at least one of the ground lines of said array to a predetermined low voltage potential during programming of the threshold voltages; and
    a wordline program voltage controller operatively connected to at least one of the wordlines of said array, said wordline program voltage controller provides a stepped wordline voltage to the at least one of the wordlines of said array dependent on a signal level on the at least one of the ground lines of said array.

9. A semiconductor memory device as recited in claim 8, wherein the stepped wordline voltage is increased in successive steps during programming of the threshold voltages.

10. A semiconductor memory device as recited in claim 9, wherein the number of successive steps in which the stepped wordline voltage increases is dependent upon the threshold voltage level to be programmed.

11. A semiconductor memory device as recited in claim 8, wherein said wordline program voltage controller comprises:
   a comparator operatively connected to the at least one of the ground lines of said array, said comparator compares the signal level on the at least one of the ground lines of said array with a reference signal to produce a next-step signal; and
   a voltage generator operatively connected to said comparator, said voltage generator produces the stepped wordline voltage for the at least one of the wordlines of said array in accordance with the next-step signal from said comparator.

12. A semiconductor memory device as recited in claim 11,
   wherein the stepped wordline voltage is increased in successive steps during programming of the threshold voltages, and
   wherein during programming of the threshold voltages, said voltage generator outputs the next successive step of the stepped wordline voltage upon receiving the next-step signal from said comparator.

13. A semiconductor memory device as recited in claim 12, wherein the successive steps of the stepped wordline voltage include an 8 Volt step, a 10 Volt, and a 12 Volt step.

14. A semiconductor memory device as recited in claim 8,
   wherein the predetermined low voltage potential is a about 2.3 Volts, and
   wherein said program current controller comprises a MOS FET that couples the at least one of the ground lines of said array to the predetermined low voltage potential.

15. A semiconductor memory device as recited in claim 14, wherein said program current controller produces a controlled current through the MOS FET during programming.

16. A semiconductor memory device as recited in claim 15, wherein the controlled current is dependent on fabrication characteristics of the memory cells in said array.

17. A method for programming a threshold voltage level in a memory cell of an electricially programmable semiconductor memory device to one of a plurality of predetermined threshold voltage levels, said method comprising:
   (a) applying a high voltage to a drain terminal of the memory cell;
   (b) applying a first gate voltage to a gate terminal of the memory cell during a first programming phase when a first threshold voltage level is being programmed;
   (c) coupling a source terminal of the memory cell to a low voltage;
   (d) monitoring the voltage on the source terminal of the memory cell during the programming to determine when the first threshold voltage level has been programmed; and
   (e) subsequently applying a second gate voltage to the gate terminal of the memory cell during a second programming phase after said monitoring (d) determines that the first threshold voltage level has been programmed and when a second threshold voltage level is being programmed, the second gate voltage being greater than the first gate voltage.

18. A method as recited in claim 17, wherein the low voltage is about 2.3 Volts and the first gate voltage is greater that the high voltage.

19. A method as recited in claim 18, wherein the first threshold voltage is about 8 Volts, the second threshold voltage is about 10 Volts, and the high voltage is about 6–7 Volts.

20. A method as recited in claim 17, wherein said monitoring (d) comprises:
   (d1) monitoring the voltage on the source terminal of the memory cell during the programming;
   (d2) comparing the voltage on the source terminal with a reference voltage; and
   (d3) determining that the first threshold voltage level has been programmed when said comparing (d2) indicates that the voltage on the source terminal is less than or equal to the reference voltage.

21. A method as recited in claim 17, wherein said coupling (c) of the source terminal of the memory cell to the low voltage is through a semiconductor component.

22. A method as recited in claim 17, wherein said method further comprises:
   (f) monitoring the voltage on the source terminal of the memory cell during the programming to determine when the second threshold voltage level has been programmed; and
   (g) subsequently applying a third gate voltage to the gate terminal of the memory cell during a third programming phase after said monitoring (f) determines that the second threshold voltage level has been programmed and when a third threshold voltage level is being programmed, the third gate voltage being greater than the second gate voltage.

* * * * *